(12) United States Patent
Hirooka

(10) Patent No.: US 7,641,736 B2
(45) Date of Patent: Jan. 5, 2010

(54) METHOD OF MANUFACTURING SIC SINGLE CRYSTAL WAFER

(75) Inventor: Taisuke Hirooka, Hyogo (JP)

(73) Assignee: Hitachi Metals, Ltd., Tokyo (JP)

( * ) Notice: Subject to any disclaimer, the term of this patent is extended or adjusted under 35 U.S.C. 154(b) by 490 days.

(21) Appl. No.: 10/545,306

(22) PCT Filed: Feb. 22, 2005

(86) PCT No.: PCT/JP2005/002791

§ 371 (c)(1),
(2), (4) Date: Aug. 11, 2005

(87) PCT Pub. No.: WO2006/090432

PCT Pub. Date: Aug. 31, 2006

(65) Prior Publication Data

US 2007/0051301 A1    Mar. 8, 2007

(51) Int. Cl.
    *C30B 29/16* (2006.01)
(52) U.S. Cl. .............. 117/97; 117/20; 117/58; 117/103; 117/951; 438/769; 438/770; 438/771; 438/931
(58) Field of Classification Search ............ 117/101, 117/3, 84, 87, 95, 109, 50, 58, 80, 97, 103, 117/108, 20, 66, 951; 438/770, 931, 16, 438/105, 234, 320, 424, 706, 406, 712, 758, 438/769, 771; 257/77; 427/572
See application file for complete search history.

(56) References Cited

U.S. PATENT DOCUMENTS

| | | | | |
|---|---|---|---|---|
| 4,981,551 A | * | 1/1991 | Palmour | 438/712 |
| 5,483,084 A | * | 1/1996 | Hirabayashi | 257/77 |
| 5,807,432 A | * | 9/1998 | Hirabayashi | 117/87 |
| 5,972,801 A | * | 10/1999 | Lipkin et al. | 438/770 |
| 5,980,999 A | * | 11/1999 | Goto et al. | 427/572 |
| 6,004,866 A | * | 12/1999 | Nakano et al. | 438/459 |
| 6,025,273 A | * | 2/2000 | Chen et al. | 438/706 |
| 6,214,107 B1 | * | 4/2001 | Kitabatake | 117/95 |

(Continued)

FOREIGN PATENT DOCUMENTS

JP     04092898 A  *  3/1992

(Continued)

OTHER PUBLICATIONS

Official Communication dated Nov. 1, 2005, issued in the corresponding Japanese Patent Application No. 2003-295589. (With full English translation).

(Continued)

*Primary Examiner*—Eric Hug
*Assistant Examiner*—Seyed Masoud Malekzadeh
(74) *Attorney, Agent, or Firm*—Keating and Bennett, LLP

(57) ABSTRACT

A method of manufacturing an SiC single crystal wafer according to the present invention includes the steps of: (a) preparing an SiC single crystal wafer 10 with a mirror-polished surface; (b) oxidizing the surface of the SiC single crystal wafer 10 with plasma, thereby forming an oxide layer 12 on the surface of the SiC single crystal wafer; and (c) removing at least a portion of the oxide layer 12 by a reactive ion etching process. Preferably, the surface of the wafer is planarized by repeatedly performing the steps (b) and (c) a number of times.

13 Claims, 3 Drawing Sheets

U.S. PATENT DOCUMENTS

| | | | |
|---|---|---|---|
| 6,337,288 B1* | 1/2002 | Ohya et al. | 438/758 |
| 6,362,094 B1* | 3/2002 | Dabbaugh et al. | 438/637 |
| 6,384,428 B1* | 5/2002 | Oono et al. | 257/77 |
| 6,524,385 B1* | 2/2003 | Tanino et al. | 117/3 |
| 6,656,811 B2* | 12/2003 | Swanson et al. | 438/320 |
| 6,699,401 B1* | 3/2004 | Horiuchi et al. | 216/108 |
| 6,734,461 B1 | 5/2004 | Shiomi et al. | |
| 6,746,893 B1* | 6/2004 | Forbes et al. | 438/105 |
| 6,762,068 B1* | 7/2004 | Forbes et al. | 438/16 |
| 6,806,501 B2* | 10/2004 | Vanhaelemeersch et al. | 257/77 |
| 6,890,600 B2 | 5/2005 | Nakamura et al. | |
| 6,936,849 B1* | 8/2005 | Forbes et al. | 257/77 |
| 6,965,123 B1* | 11/2005 | Forbes et al. | 257/77 |
| 7,034,379 B2* | 4/2006 | Swanson et al. | 257/565 |
| 7,055,236 B2* | 6/2006 | Kamisuki et al. | 29/458 |
| 7,087,980 B2* | 8/2006 | Ebata et al. | 257/586 |
| 7,255,775 B2* | 8/2007 | Yokogawa et al. | 156/345.51 |
| 2001/0015170 A1* | 8/2001 | Kitabatake | 117/95 |
| 2002/0096104 A1* | 7/2002 | Yagi et al. | 117/84 |
| 2002/0189536 A1* | 12/2002 | Otsuki et al. | 117/109 |
| 2003/0036245 A1* | 2/2003 | Odaka et al. | 438/406 |
| 2003/0070611 A1 | 4/2003 | Nakamura | |
| 2003/0119249 A1* | 6/2003 | Swanson et al. | 438/234 |
| 2004/0046233 A1* | 3/2004 | Swanson et al. | 257/565 |
| 2004/0050320 A1* | 3/2004 | Maruyama et al. | 117/84 |
| 2004/0067370 A1* | 4/2004 | Ebata et al. | 428/446 |
| 2004/0134418 A1* | 7/2004 | Hirooka | 117/101 |
| 2005/0072189 A1* | 4/2005 | Tudryn et al. | 65/36 |
| 2005/0101100 A1* | 5/2005 | Kretchmer et al. | 438/424 |
| 2006/0163605 A1* | 7/2006 | Miyahara | 257/103 |
| 2006/0214224 A1* | 9/2006 | Ohmi et al. | 257/347 |

FOREIGN PATENT DOCUMENTS

| | | |
|---|---|---|
| JP | 06-188163 | 7/1994 |
| JP | 09-183700 | 7/1997 |
| JP | 2000-319099 | 11/2000 |
| JP | 2005-029459 | 2/2005 |
| JP | 2005-064392 | 3/2005 |
| WO | WO 01/18872 | 3/2001 |

OTHER PUBLICATIONS

Shinnittetsu Giho, "Nippon Steel Technical Report", vol. 374, pp. 32-36. 2001.

Official communication issued in the counterpart International Application No. PCT/JP2005/002791, mailed on Sep. 7, 2007.

Anthony et al.: "Surface Morphology Improvement of SiC Epitaxy by Sacrificial Oxidation," Materials Science Forum; vol. 264-268; Jan. 1, 1998; pp. 367-370.

Official communication issued in counterpart European Application No. 05710517.3, mailed on Mar. 9, 2009.

* cited by examiner

METHOD OF MANUFACTURING SIC SINGLE CRYSTAL WAFER

BACKGROUND OF THE INVENTION

1. Technical Field of the Invention

The present invention relates to a method of manufacturing an SiC single crystal wafer.

2. Description of the Related Art

SiC single crystals have a wider bandgap than Si or GaAs single crystals and exhibits a great dielectric strength and a high thermal conductivity. These properties are effectively applicable to making a semiconductor device operating at a high temperature or a power semiconductor device with a high breakdown voltage. Thus, to realize a semiconductor device that can exhibit outstanding characteristics that have never been achieved by any conventional semiconductor such as silicon, semiconductor devices of SiC single crystals have been researched and developed extensively. SiC single crystals grown by a conventional technique would often have unsatisfactory crystal quality. That is why a semiconductor device used to be fabricated on an SiC epitaxial layer grown on a wafer consisting essentially of SiC single crystals. Recently, however, SiC single crystals of quality can sometimes be obtained, and a method of fabricating a semiconductor device directly on an SiC wafer also started being researched.

Meanwhile, GaN based semiconductor devices that emit an ultraviolet ray or a blue ray have also been researched as a light source for reading and writing information from/on an optical storage medium at a high density, presenting an image, or providing general illumination. However, it is usually difficult to grow a GaN based semiconductor to the shape of a big single crystal ingot with few crystal defects. That is why a technique of epitaxially growing a GaN based semiconductor layer on an SiC single crystal wafer is now an object of a lot of attention in the art.

For that purpose, an SiC single crystal wafer with a flat and non-warped surface having no flaws is in high demand. The present inventor proposed a technique of making a flat SiC wafer by removing processing stress in a Japanese patent application that has not been laid open yet.

On the other hand, a chemical mechanical polishing (CMP) process has been used often as a typical technique of planarizing the surface of an SiC wafer. However, SiC is the second hardest material after diamond, and therefore, cannot be planarized at a sufficiently high polishing rate by the CMP process, resulting in poor processing efficiency. To increase the polishing rate, there is known a method of performing a CMP process with high pressure applied to an SiC wafer. In that case, an affected layer could be easily produced deep inside the SiC wafer.

To overcome these problems, Patent Document No. 1 discloses a method of planarizing the surface of an SiC wafer by using a reactive etching and a water vapor oxidation in combination. More specifically, according to that method, the surface of an SiC wafer is mirror-polished mechanically, cleaned with organic and inorganic liquids, and then subjected to a reactive etching process. In this manner, a damage layer is removed uniformly with the surface kept sufficiently planar. Thereafter, the surface of the wafer is oxidized with water vapor and then the resultant oxide layer is removed with hydrofluoric acid.

Patent Document No. 2 discloses a process in which an affected layer is removed from the surface of an SiC wafer by a first reactive etching process using Ar, for example, and then an ion bombardment damage layer, produced in a surface area of the wafer as a result of the first reactive etching process, is removed by another reactive etching process using $CF_4$ and $O_2$.

Also, Non-patent Document No. 1 reports that the processing efficiency can be improved by oxidizing the surface of an SiC wafer with water vapor and then subjecting the wafer to a CMP process.

However, in the reactive ion etching processes adopted in these conventional methods, the etching action advances almost without altering the original surface shape. Accordingly, if the surface of the wafer has flaws, then those flaws cannot be flattened out completely even through the reactive etching process. In addition, in a reactive ion etching process, the wafer is bombarded with accelerated radical species, and it is difficult to fully repair the damage caused on the wafer. The process in which an oxide layer is formed by water vapor oxidation and then removed is not practical, either, because the SiC wafer needs to be exposed to water vapor for a long time while being kept heated to a high temperature.

That is why it is difficult to planarize the surface of the wafer and remove the damage layer from the wafer surface completely according to the methods disclosed in Patent Documents Nos. 1 and 2. In the method disclosed in Non-patent Document No. 1, the polishing process can be finished in a shorter time than a method by which the surface of the SiC wafer is planarized only by a CMP process. Even so, it still takes about three hours to get the oxidation process done and about two hours to finish the polishing process according to the method disclosed in Non-patent Document No. 1, which is also far from being actually usable. In addition, it is hard to eliminate the flaws from the wafer surface completely, too.

Patent Document No. 1: Japanese Patent Application Laid-Open Publication No. 6-188163

Patent Document No. 2: Japanese Patent Application Laid-Open Publication No. 9-183700

Non-patent Document No. 1: Sinnittetsu Giho (Nippon Steel Technical Report) Vol. 374, pp. 32-36

SUMMARY OF THE INVENTION

In order to overcome the problems described above, an object of the present invention is to provide a practical method of manufacturing an SiC wafer with a planarized surface.

A method of manufacturing an SiC single crystal wafer according to the present invention includes the steps of: (a) preparing an SiC single crystal wafer with a mirror-polished surface; (b) oxidizing the surface of the SiC single crystal wafer with plasma, thereby forming an oxide layer on the surface of the SiC single crystal wafer; and (c) removing at least a portion of the oxide layer by a reactive ion etching process.

In one preferred embodiment, the steps (b) and (c) are repeatedly performed a number of times.

In another preferred embodiment, the oxidation in the step (b) and the etching process in the step (c) are each carried out for one to ten minutes.

In another preferred embodiment, the method further includes, after repeatedly performing the steps (b) and (c) a number of times and finishing the step (b) for the last time, the step (d) of polishing the surface of the SiC single crystal wafer by a chemical mechanical polishing process.

In another preferred embodiment, the step (b) includes using either oxygen or a mixture of oxygen and an inert gas.

In another preferred embodiment, the step (c) includes using a gas including F.

In another preferred embodiment, the step (c) includes defining conditions of the reactive ion etching process such that SiC and the oxide layer are etched at the same rate.

In another preferred embodiment, the step (a) includes preparing an SiC single crystal wafer that has an offset angle of substantially zero degrees with respect to C-axis.

In another preferred embodiment, the steps (b) and (c) are carried out in the same system with gases changed.

A method of manufacturing an SiC single crystal wafer according to a preferred embodiment of the present invention includes the step of planarizing the surface of the SiC single crystal wafer by repeatedly performing, a number of times, the step of oxidizing the surface of the SiC single crystal wafer and the step of etching away an oxide layer produced by the step of oxidizing.

In one preferred embodiment, the number of times is at least five.

An SiC single crystal wafer according to the present invention is manufactured by one of the methods described above.

Another SiC single crystal wafer according to the present invention has a surface roughness Ra of 0.2 nm or less and a stepped surface structure.

These and other features, elements, characteristics and advantages of the present invention will become more apparent from the following detailed description of preferred embodiments with reference to the attached drawings.

DETAILED DESCRIPTION OF PREFERRED EMBODIMENTS

According to the present invention, the surface of SiC is oxidized with plasma and an oxide layer, produced by the oxidation, is removed by a reactive ion etching process. In this manner, an oxide layer can be formed and removed at practical rates. Consequently, the resultant SiC single crystal wafer has a sufficiently planarized surface, from which scratches have been cleaned up completely.

In addition, by repeatedly oxidizing the surface of SiC and removing the oxide layer produced by the oxidation a number of times, a planar SiC single crystal wafer can be obtained.

CMP is one of the best polishing methods that is used extensively today in polishing a semiconductor wafer or planarizing a semiconductor structure just formed. However, when the present inventor polished a mirror-polished SiC single crystal wafer by the CMP process with pressure applied thereto, the present inventor discovered that a flat surface could be formed locally but scratches with depths of about 10 nm to about 20 nm were made all over the wafer.

This should be because SiC has such physical properties that include high hardness and high chemical resistance but that are brittle enough to get scratched easily. That is why as long as the polishing process is carried out by the CMP technique, the scratches on the surface of an SiC wafer are once flattened out through the polishing process but additional scratches are newly made on the polished surface again.

To overcome this problem, the present inventor researched an effective method of planarizing the surface of an SiC wafer by a non-polishing technique. As a result, the present inventor discovered that the surface of the SiC wafer could be planarized sufficiently by oxidizing the wafer surface once and then etching away an oxide layer produced by the oxidation. As will be described in detail later, particularly by repeatedly performing the oxidation and oxide layer removal a number of times, the surface profile can be rounded little by little and the grooves created due to flaws or scratches can be gradually made shallower and shallower, thereby planarizing the wafer surface.

Hereinafter, a method of manufacturing an SiC single crystal wafer according to the present invention will be described in detail.

Figure 1:
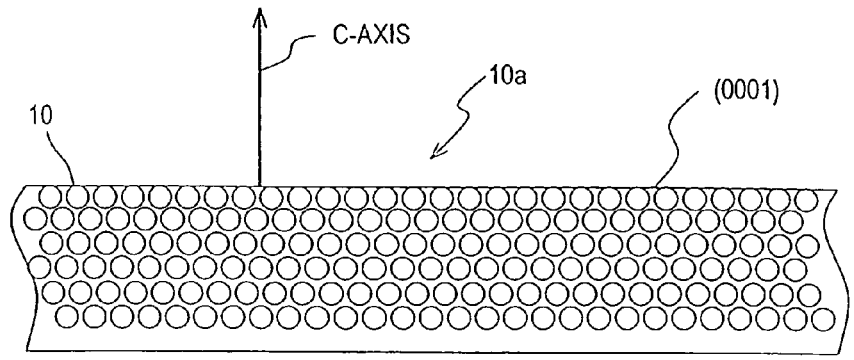
FIG. 1 is a cross-sectional view showing a plane orientation and an offset angle of an SiC wafer that can be used effectively in the present invention.

First, an SiC single crystal wafer consisting of SiC single crystals is prepared. The SiC single crystals preferably have a hexagonal structure and more preferably are 4H—SiC or 6H—SiC. As shown in FIG. 1, the surface 10a of the SiC single crystal wafer 10 to be planarized is a (0001) plane and the offset angle of the wafer preferably defines approximately zero degrees with respect to the C-axis as the crystallographic axis. Such a wafer is sometimes called a "just wafer". In other words, the C-axis is preferably perpendicular to the surface 10a. If the offset angle is zero degrees as shown in FIG. 1, C layers and Si layers are ideally alternately stacked one upon the other parallel to the surface 10a. In such a wafer, the overall surface is uniformly made of Si or C and is usually hard to polish due to its high physical and chemical stability. According to the SiC single crystal wafer manufacturing method of the present invention, however, even such a wafer can be planarized effectively.

Figure 2:
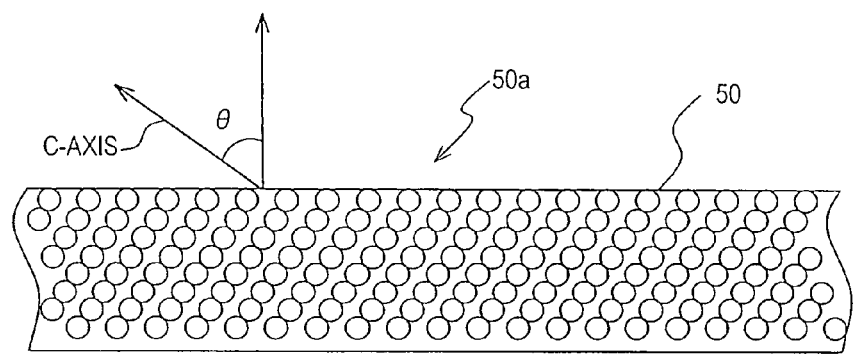
FIG. 2 is a cross-sectional view showing another plane orientation and another offset angle of the SiC wafer.

As shown in FIG. 2, even in an SiC single crystal wafer 50 made of either 4H—SiC or 6H—SiC single crystals, if the offset angle θ with respect to the C-axis is not equal to zero degrees, Si or C always appears on the surface 50a of the wafer 50. Such a surface is usually easy to process and can be planarized relatively easily even by the conventional polishing or planarizing method. Likewise, if the method of the present invention is applied to such a wafer with an offset angle θ of non-zero degrees as shown in FIG. 2, the surface can also be planarized efficiently.

The surface 10a of the SiC single crystal wafer 10 to planarize is preferably mirror-polished and mirror-finished in advance, and more preferably has a surface roughness Ra of 0.2 nm to 2 nm. As used herein, the "surface roughness Ra" refers to a value obtained by measuring a 5 μm area of a sample with an atomic force microscope (AFM). Also, if the SiC single crystal wafer 10 has a diameter of 2 inches, for example, the warp of the wafer is preferably adjusted such that the surface to planarize has a degree of planarity of approximately ±20 μm or less. However, even if the degree of planarity is more than ±20 μm, the warp of the wafer can also be corrected during the manufacturing process of the SiC single crystal wafers to be described below.

Figure 3:
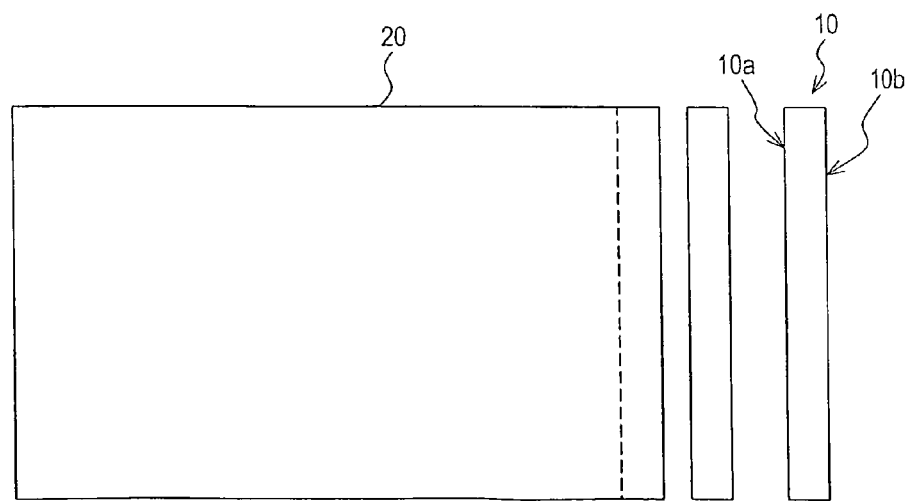
FIG. 3 illustrates the process step of cutting out an SiC wafer from an ingot.

As shown in FIG. 3, the SiC single crystal wafer 10 may be cut out from an ingot 20 of single crystal SiC by a known method. The SiC ingot 20 may be cut with either a cutting blade with an outer or inner edge or a wire saw, for example. The SiC ingot 20 may include not only Si and C but also other elements to be p- or n-type dopants. The ingot 20 may further include Ge or any other Group IV element as a substituent. SiC including those dopants and substituents will also be referred to herein as "SiC". The profile of the SiC wafer 10 is not particularly limited, and an SiC wafer having any of various sizes, thicknesses and planar shapes may be used in the present invention. For example, a disklike SiC single crystal wafer 10 with a diameter of about 2 inches and a thickness of about 500 μm is prepared.

The SiC single crystal wafer 10, cut out from the ingot 20, has its surface affected layer removed by a known process and then is polished until the surface roughness reaches a predetermined value on the principal surface 10a and back surface 10b thereof. Also, if the SiC single crystal wafer 10 is warped at this point in time, then the wafer 10 is also subjected to a planarizing process so as to have a predetermined degree of planarity or less.

Figure 4:
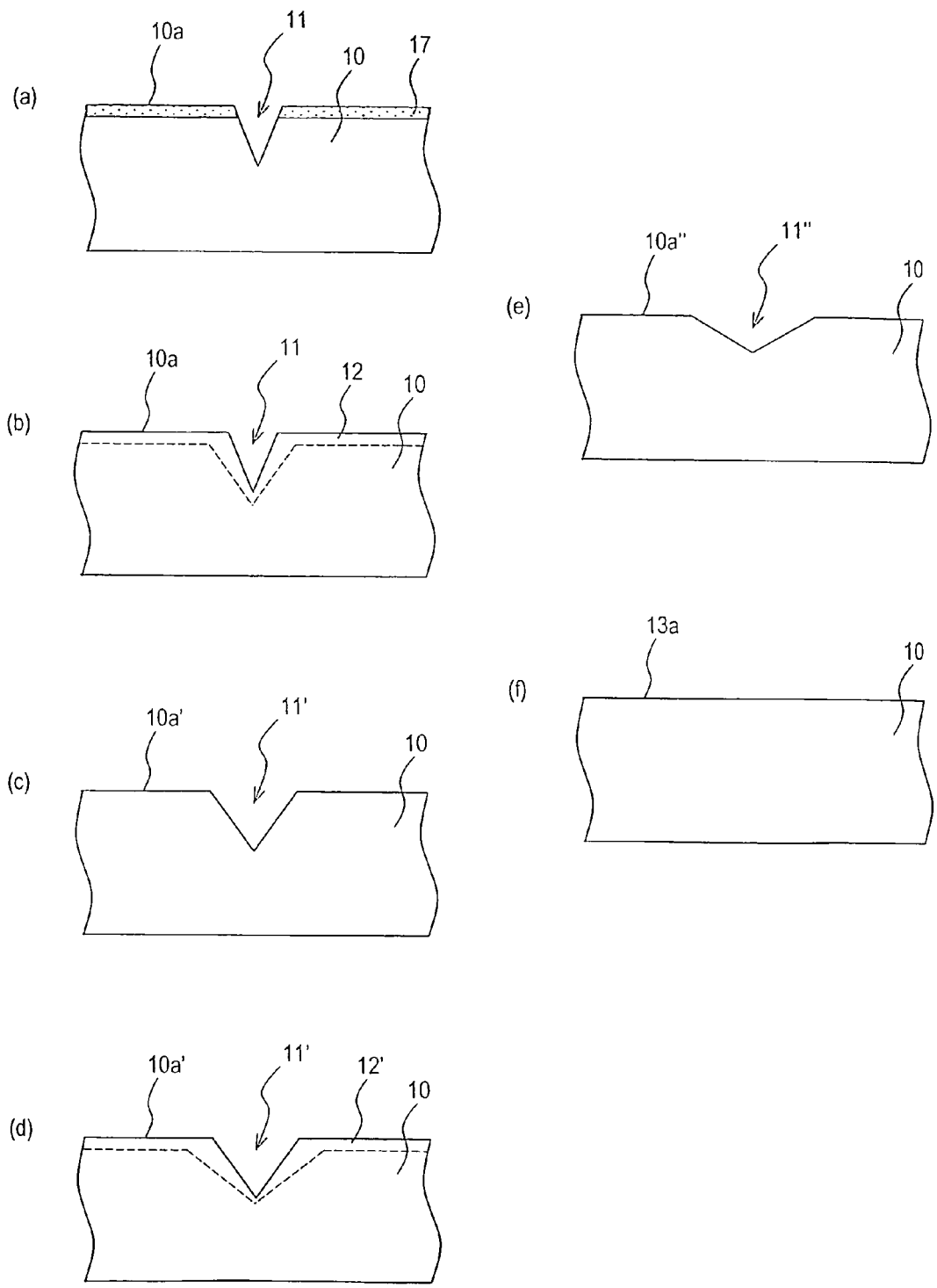
FIGS. 4(a) through 4(f) schematically illustrate cross sections of an SiC wafer near its surface in respective process steps of an SiC wafer manufacturing process according to the present invention.

FIG. 4(a) schematically illustrates the surface 10a and its surrounding portion of the SiC single crystal wafer 10. The surface 10a of the SiC single crystal wafer 10 has a surface roughness on the order of several nanometers. The wafer 10 may have a processing flaw 11 on its surface 10a and/or an affected layer 17 near its surface. For that reason, the surface 10a of the SiC single crystal wafer 10 prepared in this manner is preferably etched first to remove the affected layer. The etching process is preferably a reactive ion etching process that will also be carried out later in the process step of removing an oxide layer, and the etching conditions are also defined accordingly. Subsequently, the surface 10a is oxidized by any of various known methods, thereby forming an oxide layer under the surface of and within the SiC single crystal wafer, as shown in FIG. 4(b). However, if the SiC single crystal wafer 10 used has an offset angle of zero degrees, neither the water vapor oxidation nor the etchant oxidation is preferred. This is because the oxide layer is produced too slowly by the water vapor oxidation and because the etching process does not advance smoothly or efficiently by the etchant oxidation. The reason is that the surface 10a, to which Si and C layers have been stacked one upon the other parallel, exhibits poor chemical reactivity. That is why the surface is preferably oxidized with plasma. The oxidation is preferably carried out either in an oxygen atmosphere or in an atmosphere including oxygen and an inert gas of Ar, for example, with a pressure of about $10^{-1}$ Pa to $10^2$ Pa and a power of 0.01 W/cm$^2$ to 2 W/cm$^2$ applied. This process is preferably carried out in the same system as the next reactive ion etching process. This is because the two processes can be carried out continuously then just by changing the gases and without transporting the SiC single crystal wafer 10 at all. As a result of this oxidation process, an oxide layer 12 is formed on the surface as shown in FIG. 4(b).

Next, the oxide layer 12 is removed. The oxide layer 12 may be removed by a known chemical and mechanical process. However, the technique of removing the oxide layer 12 by a CMP process with pressure applied thereto is not preferred. This is because additional scratches will be made as described above while the oxide layer 12 is being removed. That is why to prevent any additional affected layer or scratches from being newly produced, the oxide layer 12 is preferably removed by a chemical method and more particularly by a reactive ion etching process. In the reactive ion etching process, a gas including F is preferably used and CF$_4$ gas is more preferably used. The oxide layer 12 is preferably removed almost completely from the entire surface of the wafer 10. Also, the oxide layer 12 is preferably removed under such reaction conditions that make the etch rate of the oxide layer 12 and that of SiC in the SiC wafer 10 equal to each other. In that case, flat portions of the oxide layer 12 are removed earlier than portions surrounding the processing flaw 11 due to the anisotropy of the reactive ion etching process. Thus, the SiC single crystal wafer 10 has its surface soon exposed and then is etched itself. As a result, as shown in FIG. 4(b), the processing flaw 11' that remains after the oxide layer 12 has been removed becomes shallower than the original processing flaw 11 before the oxide layer 12 is removed. Consequently, the surface 10a' of the SiC single crystal wafer 10 has improved planarity.

In this process step of removing the oxide layer 12, the etching process is typically carried out for one to ten minutes, although its duration is changeable according to the thickness of the oxide layer 12 to remove or the type of the etching gas.

According to the present invention, the oxidation process step and the removal process step described above are preferably carried out repeatedly a number of times. Another oxide layer 12' is formed under the surface 10a' of the SiC single crystal wafer 10 as shown in FIG. 4(d) by the oxidation process described above and then removed by the etching process described above. As a result, the SiC single crystal wafer 10 has a surface 10a" with further improved planarity as shown in FIG. 4(e). That is to say, the depth of the processing flaw 11" remaining on the surface 10a" is smaller than that of the processing flaw 11' before the oxide layer 12' is formed and removed.

By repeatedly performing these oxidation and removal process steps more times, the processing flaw on the surface of the SiC single crystal wafer 10 decreases its depth little by little and increases its planarity gradually. The oxidation and removal process steps are preferably carried out alternately at least twice, and more preferably fives times or more. If the oxidation and removal process steps are repeated about ten times, almost perfect planarity is realized. Even if the number of times of repetition exceeds fifteen, the resultant surface planarity is still very good but it takes a lot of time to get these process steps done repeatedly that many times, which cannot be called an efficient process. In view of this consideration, the oxidation and removal process steps are most preferably repeated five to ten times. According to the method of the present invention, the oxidation process step and the process step of etching away the oxide layer produced by the oxidation process step can be performed in the same system. Accordingly, even if the short-term oxidation and etching process steps are repeated a number of times, the time and trouble of transporting the SiC single crystal wafer 10 to another system can still be saved. Consequently, compared to the conventional method that uses the water vapor oxidation and chemical etching, these process steps can be repeatedly performed far more efficiently according to the present invention. By repeatedly carrying out the oxidation and removal process steps in this manner, the SiC single crystal wafer 10 can have a planarized surface 13a with no processing flaws 11 as shown in FIG. 4(f).

Figure 5:
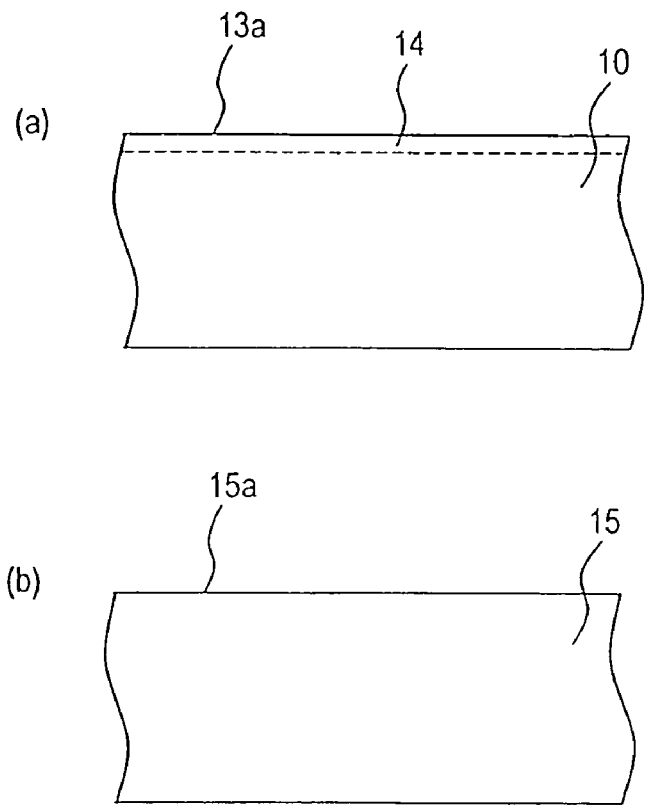
FIGS. 5(a) and 5(b) schematically illustrate cross sections of the SiC wafer near its surface in other process steps of the SiC wafer manufacturing process of the present invention.

The SiC single crystal wafer 10 obtained by performing these process steps has a surface roughness Ra of less than about 0.4 nm and sufficiently high planarity. However, the uppermost surface of the SiC single crystal wafer 10 has still been somewhat damaged by the ions that have collided against that surface during the reactive ion etching process to remove the oxide layer. Thus, this damaged portion is preferably repaired. For that purpose, the repetition of the oxidation and removal process steps preferably ends with the oxidation process step described above. As shown in FIG. 5(a), the surface 13a of the SiC single crystal wafer 10 is oxidized to produce an oxide layer 14, thereby forming an oxide layer on under the surface of and within the SiC single crystal wafer 10. And the oxide layer 14 is preferably removed by a CMP process with low pressure applied. This CMP process is preferably carried out with colloidal silica and a nonwoven fabric. The oxide layer 14 can be removed at a practical polishing rate even by a normal CMP process. In this case, however, since the CMP process is carried out with low pressure applied, there is no concern about newly producing unwanted scratches or affected layer on the surface. As a result, the resultant SiC single crystal wafer 15 has a flat surface 15a with no flaws and with its lattice arrangement refined by removing the damaged or affected layer from around the surface.

Figure 6:
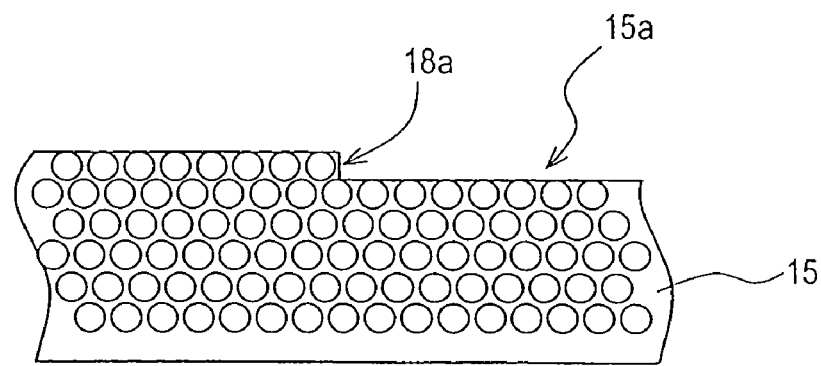
FIG. 6 schematically illustrates a cross-sectional structure of an SiC wafer according to the present invention in the vicinity of its surface.

FIG. 6 schematically illustrates the surface of the SiC single crystal wafer 15 obtained by the method of this preferred embodiment. The surface 15a of the SiC single crystal wafer 15 has a surface roughness Ra of less than 0.2 nm. However, when the SiC single crystal wafer 15 is cut out, it is difficult to realize an ideal offset angle of zero degrees. Consequently, the surface 15a of the SiC single crystal wafer 15 has a stepped structure 18, of which the height is equal to that of a monoatomic layer.

As described above, according to the present invention, an SiC single crystal wafer with high surface planarity can be obtained by repeatedly performing, a number of times, an oxidation process step and the process step of removing an oxide layer produced by the oxidation process step. In particular, by carrying out a plasma oxidation and a reactive ion etching in combination, the surface can be finished in a practical amount of processing time. In addition, since the damaged layer or affected layer has been removed from around the surface of the SiC single crystal wafer, excellent semiconductor properties are also realized around the surface.

Hereinafter, specific experimental examples of the present invention will be described.

Experimental Example No. 1

A 4H (0001) just wafer with a diameter of 2 inches and a thickness of 350 μm was prepared as an SiC single crystal wafer. The wafer was finished to have a surface roughness Ra of 1.0 nm.

This wafer was loaded into the chamber of a parallel plate reactive ion etching system. Oxygen was introduced into the chamber at a flow rate of 100 sccm and a power of 0.2 W/cm$^2$ was applied to the chamber with its internal pressure kept at 0.7 Pa, thereby generating a plasma. The wafer was exposed to the plasma for five minutes to oxidize the wafer surface.

Thereafter, with the wafer still loaded in the chamber, a reactive gas of CF$_4$ was introduced into the chamber at a flow rate of 100 sccm, and a power of 0.2 W/cm$^2$ was applied to the chamber with its internal pressure kept at 0.7 Pa, thereby etching the surface of the wafer for five minutes.

After these oxidation and etching processes were alternately carried out ten times, the wafer was oxidized again. Subsequently, the SiC single crystal wafer was unloaded and had its surface polished by a CMP process using colloidal silica.

The SiC single crystal wafer thus obtained was observed with an atomic force microscope (AFM). When the level difference of the wafer was calculated within a 5 μm×5 μm area, the surface roughness Ra thereof was 0.17 nm. And that surface had a linear stepped structure.

Experimental Example No. 2

A 6H (0001) just wafer with a diameter of 2 inches and a thickness of 350 μm was prepared as an SiC single crystal wafer. And an SiC single crystal wafer was obtained in the same procedure and under the same conditions as the first experimental example.

The resultant wafer had a surface roughness Ra of 0.13 nm and also had a linear stepped structure on its surface.

As can be seen from the results of these experimental examples, no matter whether a 4H—SiC single crystal wafer or a 6H—SiC single crystal wafer was used, the damaged layer or affected layer could always be removed and a highly planarized surface with refined lattice arrangement could be obtained.

According to the present invention, an SiC single crystal wafer with an extremely flat surface can be obtained. Thus, by epitaxially growing an GaN based semiconductor layer or an SiC based semiconductor layer with good properties on this SiC wafer, GaN based or SiC based semiconductor devices with excellent characteristics can be fabricated. Also, even when a semiconductor device is fabricated in such an SiC single crystal wafer, an SiC based semiconductor device with excellent characteristics can also be obtained because the surface region has good semiconductor properties.

Although the present invention has been described and illustrated in detail with reference to certain preferred embodiments thereof, it is clearly understood that the same is by way of illustration and example only and is not to be taken by way of limitation, the spirit and scope of the present invention being limited only by the terms of the appended claims.

The invention claimed is:

1. A method of manufacturing an SiC single crystal wafer, the method comprising the steps of:
    (a) preparing an SiC single crystal wafer with a mirror-polished surface;
    (b) after step (a), oxidizing the surface of the SiC single crystal wafer with plasma, thereby forming an oxide layer under the surface of and within the SiC single crystal wafer; and
    (c) after step (b), removing at least a portion of the oxide layer by a reactive ion etching process; wherein
    the step of removing at least a portion of the oxide layer by a reactive ion etching process includes removing substantially the entire oxide layer.

2. The method of claim 1, wherein the steps (b) and (c) are repeatedly performed a number of times.

3. The method of claim 2, wherein the oxidation in the step (b) and the etching process in the step (c) are each carried out for one to ten minutes.

4. The method of claim 2, further comprising, after repeatedly performing the steps (b) and (c) a number of times and finishing the step (b) for the last time, the step (d) of polishing the surface of the SiC single crystal wafer by a chemical mechanical polishing process.

5. The method of claim 1, wherein the step (b) includes using either oxygen or a mixture of oxygen and an inert gas.

6. The method of claim 1, wherein the step (c) includes using a gas including F.

7. The method of claim 1, wherein the step (c) includes defining conditions of the reactive ion etching process such that SiC and the oxide layer are etched at the same rate.

8. The method of claim 1, wherein the step (a) includes preparing an SiC single crystal wafer that has an offset angle of substantially zero degrees with respect to C-axis.

9. The method of claim 1, wherein the steps (b) and (c) are carried out in the same system with gases changed.

10. A method of manufacturing an SiC single crystal wafer, comprising the steps of:
- planarizing the surface of the SiC single crystal wafer by repeatedly performing, a number of times, the step of oxidizing the surface of the SiC single crystal wafer, thereby forming an oxide layer under the surface of and within the SiC single crystal wafer; and
- after the step of oxidizing, performing the step of etching away an oxide layer produced by the step of oxidizing; wherein the step of etching away the oxide layer includes etching away substantially the entire oxide layer.

11. The method of claim 2, wherein the number of times is at least five.

12. The method of claim 1, wherein the step of oxidizing the surface of the SiC single crystal wafer includes forming the oxide layer over substantially the entire surface of the SiC single crystal wafer.

13. The method of claim 10, wherein the step of oxidizing the surface of the SiC single crystal wafer includes forming the oxide layer on substantially the entire surface of the SiC single crystal wafer.

* * * * *